(12) United States Patent
Kanbayashi

(10) Patent No.: US 7,852,620 B2
(45) Date of Patent: Dec. 14, 2010

(54) ELECTRONIC APPARATUS, MOISTURE-PROOF STRUCTURE OF ELECTRONIC APPARATUS, AND METHOD FOR PRODUCING ELECTRONIC APPARATUS

(75) Inventor: Hatsuki Kanbayashi, Higashitagawagun-Mikawamachi (JP)

(73) Assignee: Seiko Epson Corporation (JP)

( * ) Notice: Subject to any disclaimer, the term of this patent is extended or adjusted under 35 U.S.C. 154(b) by 353 days.

(21) Appl. No.: 12/054,001

(22) Filed: Mar. 24, 2008

(65) Prior Publication Data

US 2008/0239642 A1 Oct. 2, 2008

(30) Foreign Application Priority Data

Mar. 26, 2007 (JP) .............................. 2007-078416

(51) Int. Cl.
*G06F 1/16* (2006.01)
(52) U.S. Cl. ............................. 361/679.02; 361/679.01; 361/679.03; 361/679.21; 349/58; 349/139
(58) Field of Classification Search ............. 361/679.21
See application file for complete search history.

(56) References Cited

U.S. PATENT DOCUMENTS

| | | | | |
|---|---|---|---|---|
| 5,085,605 | A * | 2/1992 | Itani et al. ........................ | 445/25 |
| 6,653,572 | B2 * | 11/2003 | Ishiwa et al. .................. | 174/250 |
| 6,888,591 | B2 * | 5/2005 | Kim .............................. | 349/58 |
| 6,956,638 | B2 * | 10/2005 | Akiyama et al. ............. | 349/187 |
| 7,087,148 | B1 * | 8/2006 | Blackburn et al. ........... | 205/452 |
| 7,176,989 | B2 * | 2/2007 | Takahara et al. .............. | 349/39 |
| 7,403,237 | B2 * | 7/2008 | Iki ............................... | 349/43 |
| 7,525,535 | B2 * | 4/2009 | Kim et al. ..................... | 345/169 |
| 7,605,380 | B2 * | 10/2009 | Maeda et al. ............. | 250/483.1 |
| 2003/0184704 | A1 * | 10/2003 | Akiyama et al. ............. | 349/158 |
| 2004/0135952 | A1 * | 7/2004 | Kurashina et al. ........... | 349/139 |
| 2005/0179852 | A1 * | 8/2005 | Kawai .......................... | 349/153 |
| 2005/0274916 | A1 * | 12/2005 | Shoji et al. ................... | 250/580 |

(Continued)

FOREIGN PATENT DOCUMENTS

JP   10-133604   5/1998

(Continued)

*Primary Examiner*—Jayprakash N Gandhi
*Assistant Examiner*—Anthony Q Edwards
(74) *Attorney, Agent, or Firm*—Harness, Dickey & Pierce, P.L.C.

(57) ABSTRACT

The invention provides an electronic apparatus including: a substrate that has a penetrating portion at a part of a periphery around a display area of the substrate; a display element that is provided over the display area of one surface of the substrate; a first moisture-proof film that has optical transparency and covers, at least, the display area of the above-mentioned one surface of the substrate and the display element; and a second moisture-proof film that covers, at least, the display area of another opposite surface of the substrate. In the configuration of the electronic apparatus according to an aspect of the invention, the first moisture-proof film is adhered to a sealing region of the above-mentioned one surface of the substrate; the second moisture-proof film is adhered to a sealing region of the above-mentioned another opposite surface of the substrate; and the first moisture-proof film and the second moisture-proof film are adhered to each other at the penetrating portion, whereby a combination of the first moisture-proof film and the second moisture-proof film seals the display element.

9 Claims, 6 Drawing Sheets

U.S. PATENT DOCUMENTS

| | | | |
|---|---|---|---|
| 2006/0077314 A1* | 4/2006 | Li et al. | 349/58 |
| 2006/0082695 A1* | 4/2006 | Miyashita | 349/58 |
| 2006/0209218 A1* | 9/2006 | Lee et al. | 349/1 |
| 2006/0215079 A1* | 9/2006 | Suzuki et al. | 349/96 |
| 2007/0009674 A1* | 1/2007 | Okubo et al. | 428/1.1 |
| 2008/0000388 A1* | 1/2008 | Abe | 106/157.8 |
| 2008/0105368 A1* | 5/2008 | Watanabe | 156/250 |
| 2009/0066228 A1* | 3/2009 | Tomai et al. | 313/504 |
| 2010/0053854 A1* | 3/2010 | Nishikawa et al. | 361/679.01 |

FOREIGN PATENT DOCUMENTS

| | | |
|---|---|---|
| JP | 2007-072127 | 3/2007 |
| JP | 2007-072128 | 3/2007 |
| JP | 2007-127763 | 5/2007 |
| JP | 2007-133202 | 5/2007 |

* cited by examiner

FIG. 8
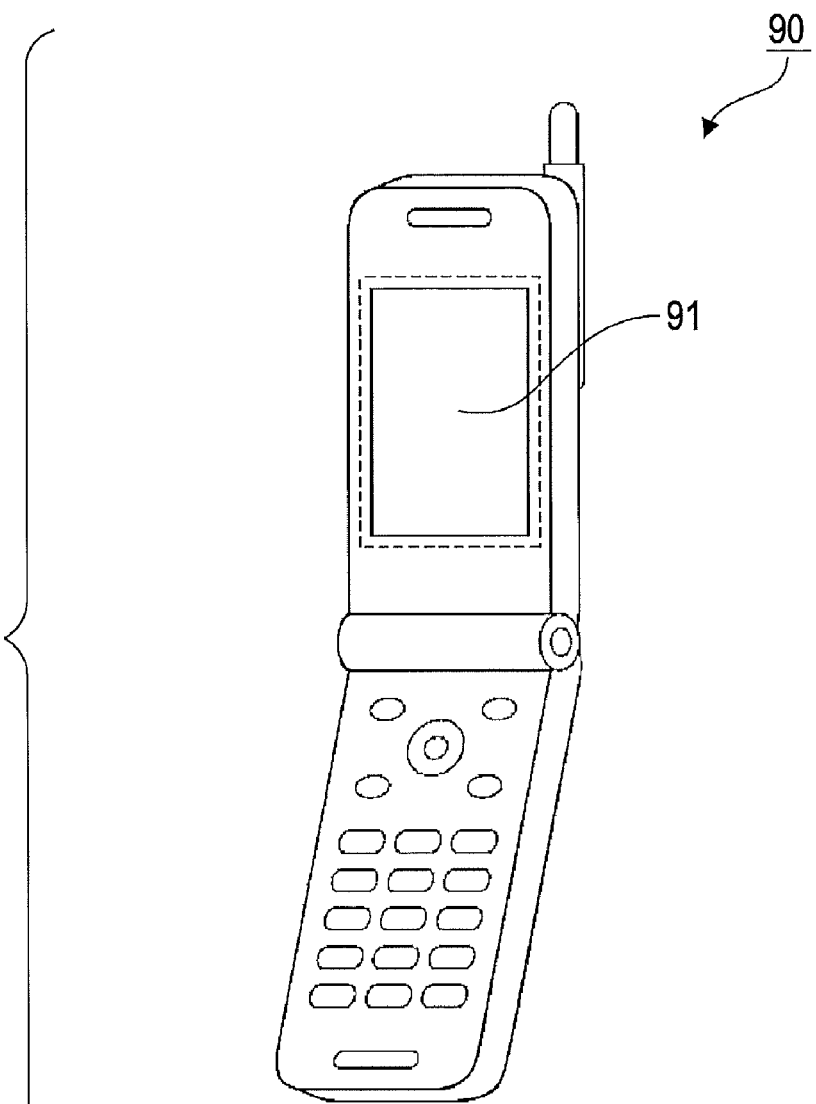
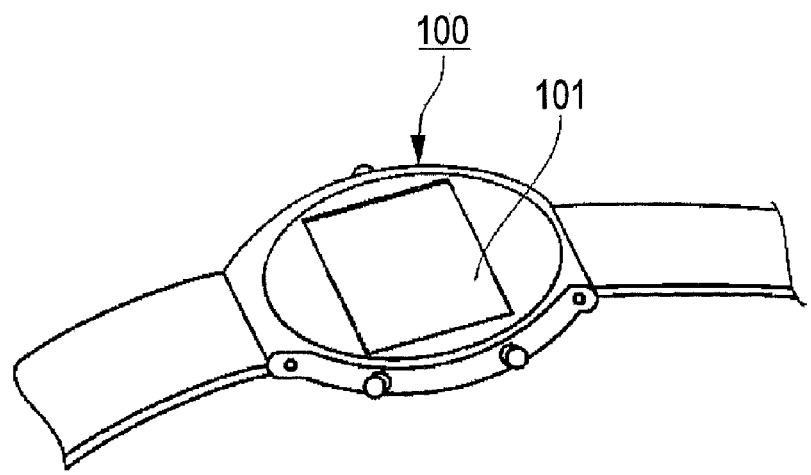

ELECTRONIC APPARATUS, MOISTURE-PROOF STRUCTURE OF ELECTRONIC APPARATUS, AND METHOD FOR PRODUCING ELECTRONIC APPARATUS

BACKGROUND

1. Technical Field

The present invention relates to an electronic apparatus, a moisture-proof structure of an electronic apparatus, and a method for producing an electronic apparatus.

2. Related Art

In recent years, a display device having a flat, flexible, compact, and lightweight body has attracted the attention of the industry as an effective means for reducing the thickness of an electronic apparatus and enhancing portability thereof. A plastic substrate is used as the substrate of such a display device and an electronic apparatus that is provided with such a display device. The plastic substrate has a disadvantage in that it does not prevent moisture. As a typical problem recognized in the related art, since the plastic substrate does not exclude moisture, the display element(s) of a display device could degrade due to any vapor/moisture that permeates the substrate, resulting in a shortened service life thereof.

One possible technical solution to such a problem is to seal the display element of a display device by means of a pair of moisture-proof films. Specifically, one of the pair of damp-proof films is adhered to the other thereof at the (outer) edges of the display device in such a manner that the pair of damp-proof films envelopes the entire body of the display device for protection against moisture. One example of such a sealing method is disclosed in JP-A-10-133604. In the configuration of some electronic apparatuses, for example, card-type electronic apparatuses, display element is provided on a substrate so as to constitute a single integrated body that is made up of a display device and an electronic apparatus. When the above-described sealing method that is disclosed in, for example, JP-A-10-133604 is applied to this type of an electronic apparatus, it is difficult to adhere one of the pair of damp-proof films to the other thereof at the peripheral region around the display element. Therefore, when the sealing method of the related art is applied to such a type of electronic apparatus, the moisture-proof film is adhered to the surface of the plastic substrate of the electronic apparatus at the peripheral region around the display element thereof.

Generally speaking, in comparison with a case where two moisture-proof films are adhered to each other, the strength of adhesion is relatively small when a moisture-proof film is adhered to a plastic substrate by means of an adhesive because the adhesive property of the plastic substrate is insufficient. For this reason, in the above-identified sealing method of the related art in which the moisture-proof film is adhered to the surface of the plastic substrate of the electronic apparatus at the peripheral region around the display element thereof, it is practically impossible, or at best difficult, to prevent moisture/vapor from permeating through a weak adhesion region where the moisture-proof film is adhered to the surface of the plastic substrate over a long period of time.

SUMMARY

An advantage of some aspects of the invention is to provide an electronic apparatus that offers enhanced protection against any undesirable permeation of moisture into a display element thereof, which is achieved by sealing around the display element that is provided on a substrate by means of a pair of moisture-proof films. The invention further provides, as an advantage of some aspects thereof, a moisture-proof structure of such an electronic apparatus and a method for production of such an electronic apparatus.

In order to address the above-identified problem without any limitation thereto, the invention provides, as a first aspect thereof, an electronic apparatus including: a substrate that has a penetrating portion at a part of a periphery around a display area of the substrate; a display element that is provided over the display area of one surface of the substrate; a first moisture-proof film that has optical transparency and covers, at least, the display area of the above-mentioned one surface of the substrate and the display element; and a second moisture-proof film that covers, at least, the display area of another opposite surface of the substrate, wherein the first moisture-proof film is adhered to a sealing region of the above-mentioned one surface of the substrate; the second moisture-proof film is adhered to a sealing region of the above-mentioned another opposite surface of the substrate; and the first moisture-proof film and the second moisture-proof film are adhered to each other at the penetrating portion, whereby a combination of the first moisture-proof film and the second moisture-proof film seals the display element.

In such a configuration, at a singularity or a plurality of penetrating portion(s) that is/are formed at a part of the periphery around the display area of the substrate, the first moisture-proof film that is provided to cover, at least, the display area of the above-mentioned one surface of the substrate and the display element and the second moisture-proof film that is provided to cover, at least, the display area of the above-mentioned another opposite surface of the substrate are adhered to each other. In the configuration of the electronic apparatus according to the first aspect of the invention, the first moisture-proof film and the second moisture-proof film, each of (or in other words, a combination of) which has a function to seal the display element, are adhered to each other at the penetrating portion, which is formed at a part of the peripheral region around the display area of the substrate. Having such a configuration, the electronic apparatus according to the first aspect of the invention makes it possible to prevent any kind of moisture/vapor from permeating into the display element with an increased reliability.

In the configuration of the electronic apparatus according to the first aspect of the invention described above, it is preferable that the substrate should have a plurality of the penetrating portions at the periphery around the display area of the substrate; and the first moisture-proof film and the second moisture-proof film should be adhered to each other at each of the plurality of penetrating portions.

In such a configuration, the first moisture-proof film and the second moisture-proof film are adhered to each other at each of a plurality of penetrating portions that is formed at the periphery around the display area of the substrate. Since the region at which the first moisture-proof film and the second moisture-proof film are adhered to each other is formed at an larger area, the electronic apparatus having the preferred configuration described above offers enhanced protection against any undesirable permeation of moisture into the display element. If the plurality of penetrating portions is formed in place of only one penetrating portion that is formed at a large region around the display area of the substrate, it is possible to strengthen the support of the display area of the substrate, which is provided by regions where the plurality of penetrating portions is not formed. Such a structure makes it possible to prevent, or at least suppress, the deformation of the substrate that could otherwise occur when the display element is mounted onto the display area of the substrate. Therefore, the electronic apparatus having the preferred configuration described above makes it possible to prevent any kind of moisture/vapor from permeating into the display element as reliably as the electronic apparatus according to the first aspect of the invention can without sacrificing the productivity/work-performance thereof in the process of production of the electronic apparatus.

In the preferred configuration of the electronic apparatus described above, it is further preferable that at least one of the plurality of penetrating portions should correspond to each position on the entire periphery around the display area of the substrate.

In such a configuration, at least one of the plurality of penetrating portions corresponds to each position on the entire periphery around the display area of the substrate; and in addition thereto, the first moisture-proof film and the second moisture-proof film are adhered to each other at each of the penetrating portions. Since the region at which the first moisture-proof film and the second moisture-proof film are adhered to each other is formed to correspond to each position on the entire periphery around the display area of the substrate, the electronic apparatus having the preferred configuration described above offers further enhanced protection against any undesirable permeation of moisture into the display element.

In the configuration of the electronic apparatus according to the first aspect of the invention described above, it is preferable that the sealing region of the above-mentioned one surface of the substrate and/or the sealing region of the above-mentioned another opposite surface of the substrate should include wiring pattern that is/are formed on the above-mentioned one surface of the substrate and/or the above-mentioned another opposite surface of the substrate.

In such a configuration, the moisture-proof film is/are adhered to the sealing region of the substrate that includes the wiring pattern (or, the moisture-proof film is/are adhered to a region including the wiring pattern of the sealing region of the substrate). Generally speaking, the force of adhesion between a moisture-proof film and an electro-conductive pattern is relatively strong in comparison with the force of adhesion between a moisture-proof film and a substrate. Therefore, the preferred configuration of the electronic apparatus described above features the increased strength of adhesion between the moisture-proof film(s) and the sealing region(s). In the preferred configuration of the electronic apparatus described above, since the strength of adhesion between the moisture-proof film(s) and the sealing region(s) is increased at a region(s) where the first moisture-proof film and the second moisture-proof film are not adhered to each other at the periphery of the display area of the substrate. Therefore, the electronic apparatus having the preferred configuration described above offers further enhanced protection against any undesirable permeation of moisture into the display element.

In the preferred configuration of the electronic apparatus described above, it is further preferable that the wiring pattern that is/are formed on the above-mentioned one surface of the substrate and/or the above-mentioned another opposite surface of the substrate should be electrically connected to the display element.

In such a configuration, the moisture-proof film is/are adhered to the sealing region of the substrate that includes the wiring pattern; and more specifically, the moisture-proof film is/are adhered to a region including the wiring pattern of the sealing region of the substrate, the wiring pattern being electrically connected to the display element. With such a configuration, the preferred electronic apparatus described above makes it possible to offer a stronger adhesion force of the moisture-proof film(s) by means of the wiring pattern(s) that is/are electrically connected to the display element.

In the configuration of the electronic apparatus according to the first aspect of the invention described above, it is preferable that the first moisture-proof film and the second moisture-proof film should be adhered to each other at a fringe of the substrate so as to envelope the substrate and the display element.

With such a configuration, a combination of the first moisture-proof film and the second moisture-proof film seals the entire body of the electronic apparatus because the pair of the first moisture-proof film and the second moisture-proof film is adhered to each other at the edges (i.e., fringe) of the substrate. For this reason, the electronic apparatus having the preferred configuration described above offers further enhanced protection against any undesirable permeation of moisture into the display element.

In the configuration of the electronic apparatus according to the first aspect of the invention described above, it is preferable that the substrate should further have a first electrode that is provided on the display area of the above-mentioned one surface of the substrate; and the display element should be an electrophoresis element that includes an upper electrode having optical transparency, the upper electrode having a second electrode that is provided to face the first electrode, and (the electrophoresis element) further includes an electrophoresis layer that is interposed between the first electrode and the second electrode.

In such a configuration, the electronic apparatus is provided with the electrophoresis element as the display element thereof. Generally speaking, an electrophoresis element is capable of continuing image display even when power is not continuously supplied thereto. Therefore, the electronic apparatus having the preferred configuration described above, which has the electrophoresis element having such a unique characteristic, features reduced power consumption, which results in extended battery life. In addition, if the preferred configuration of the electronic apparatus described above is modified in such a manner that the electrophoresis element is driven, for example, though not limited thereto, under an externally induced energy by means of a wireless medium so as to control (e.g., change) images that are displayed by the electrophoresis element, it is possible to omit any built-in power supply from the configuration of the electronic apparatus. Thus, since the electronic apparatus having the preferred configuration described above is provided with the electrophoresis element, it is possible to omit, from the configuration thereof, any opening that is used when, for example, though not limited thereto, a user replaces batteries or for any other purpose.

In order to address the above-identified problem without any limitation thereto, the invention provides, as a second aspect thereof, a moisture-proof structure of an electronic apparatus, including: a substrate that has a penetrating portion at a part of a periphery around a display area of the substrate; a display element that is provided over the display area of one surface of the substrate; a first moisture-proof film that has optical transparency and covers, at least, the display area of the above-mentioned one surface of the substrate and the display element; and a second moisture-proof film that covers, at least, the display area of another opposite surface of the substrate, wherein the first moisture-proof film is adhered to a sealing region of the above-mentioned one surface of the substrate; the second moisture-proof film is adhered to a sealing region of the above-mentioned another opposite surface of the substrate; and the first moisture-proof film and the second moisture-proof film are adhered to each other at the penetrating portion, whereby a combination of the first moisture-proof film and the second moisture-proof film seals the display element.

In such a configuration, at a singularity or a plurality of penetrating portion(s) that is/are formed at a part of the periphery around the display area of the substrate, the first moisture-proof film that is provided to cover, at least, the display area of the above-mentioned one surface of the substrate and the display element and the second moisture-proof film that is provided to cover, at least, the display area of the above-mentioned another opposite surface of the substrate are adhered to each other. In the configuration of the moisture-proof structure of an electronic apparatus according to the second aspect of the invention, the first moisture-proof film and the second moisture-proof film, each of (or in other words, a combination of) which has a function to seal the display element, are adhered to each other at the penetrating portion, which is formed at a part of the peripheral region around the display area of the substrate. Having such a configuration, the moisture-proof structure of an electronic apparatus according to the second aspect of the invention makes it possible to prevent any kind of moisture/vapor from permeating into the display element with an increased reliability.

In order to address the above-identified problem without any limitation thereto, the invention provides, as a third aspect thereof, a method for producing an electronic apparatus, including: providing a display element over a display area of one surface of a substrate; forming a penetrating portion at a part of a periphery around the display area of the substrate; providing a first moisture-proof film that has optical transparency in such a manner that the first moisture-proof film covers, at least, the display area of the above-mentioned one surface of the substrate and the display element; providing a second moisture-proof film in such a manner that the second moisture-proof film covers, at least, the display area of another opposite surface of the substrate; adhering the first moisture-proof film and the second moisture-proof film to each other at the penetrating portion; adhering the first moisture-proof film to a sealing region of the above-mentioned one surface of the substrate; and adhering the second moisture-proof film to a sealing region of the above-mentioned another opposite surface of the substrate.

In such a method, at a singularity or a plurality of penetrating portion(s) that is/are formed at a part of the periphery around the display area of the substrate, the first moisture-proof film that is provided to cover, at least, the display area of the above-mentioned one surface of the substrate and the display element and the second moisture-proof film that is provided to cover, at least, the display area of the above-mentioned another opposite surface of the substrate are adhered to each other. In the method for producing an electronic apparatus according to the third aspect of the invention, the first moisture-proof film and the second moisture-proof film, each of (or in other words, a combination of) which has a function to seal the display element, are adhered to each other at the penetrating portion, which is formed at a part of the peripheral region around the display area of the substrate. Thus, the method for producing an electronic apparatus according to the third aspect of the invention makes it possible to prevent any kind of moisture/vapor from permeating into the display element with an increased reliability.

BRIEF DESCRIPTION OF THE DRAWINGS

The invention will be described with reference to the accompanying drawings, wherein like numbers reference like elements.

FIG. 8 is a diagram that schematically illustrates the configuration of another set of examples of an electronic apparatus according to an exemplary embodiment of the invention.

DESCRIPTION OF EXEMPLARY EMBODIMENTS

With reference to the accompanying drawings, exemplary embodiments of the invention are explained below. It should be noted that different scales are used, where appropriate, for members illustrated in each of the accompanying drawings that are referred to in the following explanation. The different scales are used in order to facilitate the understanding of the unique configuration of the invention. It should be further noted that the detailed configuration of wirings/lines, connection portions, and the like are omitted, where not necessary, from each of the accompanying drawings that are referred to in the following explanation.

First Embodiment

Figure 1:
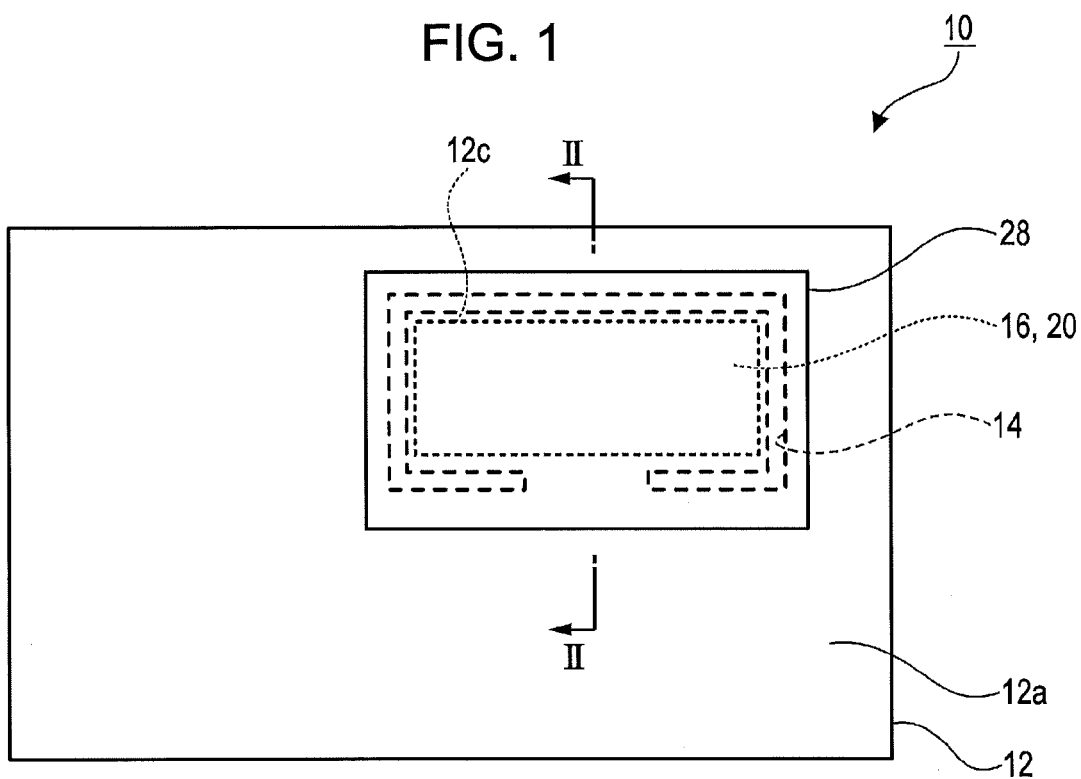
FIG. 1 is a plan view that schematically illustrates an example of the configuration of an electronic apparatus according to a first embodiment of the invention.
Figure 2:
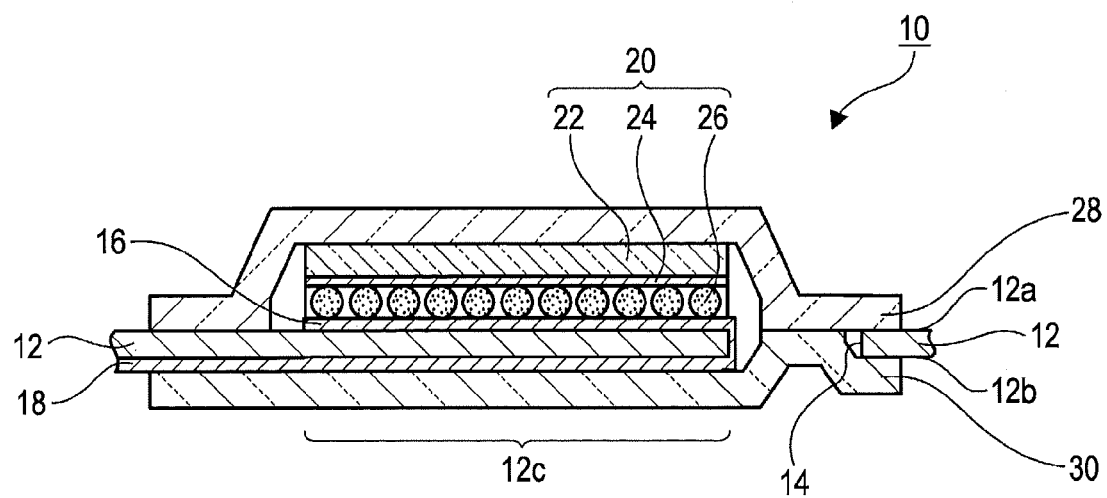
FIG. 2 is a sectional view taken along the line II-II of FIG. 1.

First of all, with reference to the accompanying drawings, the configuration of an electronic apparatus according to a first embodiment of the invention is explained below. FIG. 1 is a plan view that schematically illustrates an example of the configuration of an electronic apparatus according to the first embodiment of the invention. FIG. 2 is a sectional view taken along the line II-II of FIG. 1.

As illustrated in FIGS. 1 and 2, an electronic apparatus 10 according to the present embodiment of the invention is provided with a (lower) substrate 12, a penetration hole portion (i.e., through-hole portion) 14, a driving electrode 16, a wiring pattern (i.e., interconnecting pattern) 18, an electrophoresis element 20 that functions as a display element, a first moisture-proof film 28, and a second moisture-proof film 30.

The substrate 12 has one surface (e.g., top surface, front surface) 12a and the other (i.e., opposite) surface (e.g., bottom surface, back surface) 12b. The above-mentioned one surface 12a of the substrate 12 constitutes the image-display-side surface of the electronic apparatus 10. The above-mentioned other surface 12b of the substrate 12 constitutes the non-image-display-side surface of the electronic apparatus 10 that is opposite the image-display-side surface thereof. The substrate 12 has an display area (i.e., display region) 12c. The display area 12c is a region that is sealed between the first moisture-proof film 28 and the second moisture-proof film 30. The substrate 12 is made of a flexible material. A non-limiting example of the material of the substrate 12 is polyimide. Another non-limiting example of the material of the substrate 12 is polyethylene terephthalate (PET). Still another non-limiting example of the material of the substrate 12 is glass or a hard resin. The thickness of the substrate 12 is, for example, 25-200 µm.

The penetration hole portion 14 is formed at not the whole but a part of a peripheral region around the display area 12c of the substrate 12. Specifically, the penetration hole portion 14 is formed around (i.e., at the peripheral region that surrounds) the display area 12c of the substrate 12 except a partial region thereof where the wiring pattern 18 is formed thereon. That is, the penetration hole portion 14 is formed substantially in the shape of an alphabet "C" in a plan view so as not to go through the wiring pattern 18 (i.e., not to "overlap" the wiring pattern 18 in a plan view). A more detailed explanation of the wiring pattern 18 will be given later. It is preferable that the penetration hole portion 14 should have a width of 0.5 mm or greater when viewed from the display area 12c in an outward direction. The driving electrode 16 is provided inside the display area 12c of the top surface (front surface) 12a of the substrate 12. The driving electrode 16 is a non-limiting example of "a first electrode" according to the invention. The driving electrode 16 is made of aluminum, though not limited thereto.

The electrophoresis element 20 is formed/provided over the display area 12c of the top surface 12a of the substrate 12. As illustrated in FIG. 2, the electrophoresis element 20 is provided with, though not necessarily limited thereto, an upper substrate 22, a transparent electrode 24, and an electrophoresis layer 26. The transparent electrode 24 is a non-limiting example of "a second electrode" according to the invention. The upper substrate 22 is made of a flexible material having optical transparency. A non-limiting example of the material of the upper substrate 22 is PET. Another non-limiting example of the material of the upper substrate 22 is a hard substance such as glass or the like. The thickness of the upper substrate 22 is, for example, 25-200 µm. The transparent electrode 24 is formed on (i.e., immediately under) the upper substrate 22. The material of the transparent electrode 24 is indium tin oxide (ITO), though not limited thereto. The upper substrate 22 is provided in such a manner that the transparent electrode 24 faces the driving electrode 16.

The electrophoresis layer 26 is interposed (i.e., sandwiched) between the transparent electrode 24 and the driving electrode 16. The electrophoresis layer 26 includes but not limited to a number of microcapsules that are supported by a binder. Each of the microcapsules contains an electrophoresis dispersion medium and electrophoresis particles. Each of the electrophoresis particles has a property to move in the electrophoresis dispersion medium. One or more type (i.e., one or more color) of electrophoresis particles is used. The thickness of the electrophoresis layer 26 is, for example, 50-75 µm. Even when power is not continuously supplied thereto, the electrophoresis element 20 is capable of continuing image display. Having the electrophoresis element 20 as its display element, the electronic apparatus 10 features reduced power consumption.

As illustrated in FIGS. 1 and 2, the first moisture-proof film 28 is formed to cover the display area 12c, the electrophoresis element 20, and a peripheral region around the penetration hole portion 14 of the top surface 12a (including the penetration hole portion 14). The first moisture-proof film 28 is adhered to the second moisture-proof film 30 at the penetration hole portion 14. In addition, the first moisture-proof film 28 is adhered to the top surface 12a at the whole of the peripheral region around the display area 12c of the substrate 12. The above-described area where the first moisture-proof film 28 is adhered constitutes an image-display-side (12a) (e.g., topside, front-side) sealing region of the substrate 12. It is preferable that the image-display-side sealing region (sealing portion) formed on the top surface 12a of the substrate 12 should have a width of 2.0 mm or greater when viewed from the display area 12c in an outward direction at a region where the penetration hole portion 14 is not formed. The first moisture-proof film 28 is made up of, though not necessarily limited thereto, a film layer that is made of a moisture-proof material having optical transparency and a moisture-proof adhesive layer. It should be noted that these sub-layers of the first moisture-proof film 28 are not illustrated in the drawing. As a material of the first moisture-proof film 28, it is preferable to adopt "CELLEL" (registered trademark) (a super high moisture and oxygen barrier sheet), which is a commercial product of KUREHA CORPORATION. Needless to say, the material of the first moisture-proof film 28 should be in no case understood to be limited to the preferred one described herein.

In the configuration of the electronic apparatus 10 according to the present embodiment of the invention, the first moisture-proof film 28 is made up of the film layer and the adhesive layer as explained above. Notwithstanding the foregoing, the above-explained configuration may be modified in such a manner that the first moisture-proof film 28 does not include the adhesive layer. Depending on the material of the moisture-proof film, it is possible to configure the first moisture-proof film 28 as self-adhesive one, which does not require any adhesive layer.

As illustrated in FIG. 2, the wiring pattern 18 is formed on the bottom surface 12b of the substrate 12. One part of the wiring pattern 18 is formed at the display area 12c, whereas the other part thereof extends from the display area 12c in an outward direction so as to pass through the region where the penetration hole portion 14 is not formed. The wiring pattern 18 is electrically connected to the driving electrode 16 at an edge surface of the substrate 12. The wiring pattern 18 may be electrically connected to the driving electrode 16 via a connection portion that is provided on the substrate 12. It should be noted that the connection portion is not shown in the drawing. In other words, the wiring pattern 18 is electrically connected to the electrophoresis element 20. In addition, the wiring pattern 18 is electrically connected to a driving circuit that is provided on either the top surface 12a or the bottom surface 12b of the substrate 12. It should be noted that the driving circuit is not shown in the drawing. The wiring pattern 18 is formed as a result of patterning an electro-conductive film (i.e., conductive film) so as to have a predetermined shape. The material of the electro-conductive film is, for example, copper. The surface of the wiring pattern 18 may be electroplated with Au, Sn, though not limited thereto.

As illustrated in FIG. 2, the second moisture-proof film 30 is formed to cover the display area 12c and a peripheral region around the penetration hole portion 14 of the bottom surface 12b (including the penetration hole portion 14). The second moisture-proof film 30 is adhered to the first moisture-proof film 28 at the penetration hole portion 14. In addition, the second moisture-proof film 30 is adhered to the wiring pattern 18 at a region where the wiring pattern 18 is formed among the whole of the peripheral region around the display area 12c of the substrate 12. On the other hand, the second moisture-proof film 30 is adhered to the bottom surface 12b of the substrate 12 at the remaining region where the wiring pattern 18 is not formed. The above-described area where the second moisture-proof film 30 is adhered constitutes a non-image-display-side (12b) (e.g., bottom-side, back-side) sealing region of the substrate 12. It is preferable that the non-image-display-side sealing region (sealing portion) formed on the bottom surface 12b of the substrate 12 should have a width of 2.0 mm or greater when viewed from the display area 12c in an outward direction at a region where the penetration hole portion 14 is not formed. The second moisture-proof film 30 is made up of, though not necessarily limited thereto, a film layer that is made of a moisture-proof material and a moisture-proof adhesive layer. As a material of the second moisture-proof film 30, it is preferable to adopt the above-mentioned CELLEL® that is commercially offered by KUREHA CORPORATION. Needless to say, the material of the second moisture-proof film 30 should be in no case understood to be limited to the preferred one described herein.

In the configuration of the electronic apparatus 10 according to the present embodiment of the invention, the second moisture-proof film 30 is made up of the film layer and the adhesive layer as explained above. Notwithstanding the foregoing, the above-explained configuration may be modified in such a manner that the second moisture-proof film 30 does not include the adhesive layer. Depending on the material of the moisture-proof film, it is possible to configure the second moisture-proof film 30 as self-adhesive one, which does not require any adhesive layer.

As has already been explained above, the first moisture-proof film 28 and the second moisture-proof film 30 are adhered to each other at the penetration hole portion 14, which is formed at a part of the peripheral region around the display area 12c of the substrate 12. Each of the first moisture-proof film 28 and the second moisture-proof film 30 has a function to seal the electrophoresis element 20 so as to prevent the permeation (e.g., intrusion, entry, though not limited thereto) of moisture/vapor. In the configuration of the electronic apparatus 10 according to the present embodiment of the invention, the first moisture-proof film 28 and the second moisture-proof film 30, each of (or in other words, a combination of) which has a function to seal the electrophoresis element 20, are adhered to each other at the penetration hole portion 14, which is formed at a part of the peripheral region around the display area 12c of the substrate 12. Having such a configuration, the electronic apparatus 10 according to the present embodiment of the invention makes it possible to prevent any kind of moisture/vapor from permeating into the electrophoresis element 20 with an increased reliability.

At a "non-open" part of the peripheral region around the display area 12c of the substrate 12 where the penetration hole portion 14 is not formed, the second moisture-proof film 30 is adhered to the wiring pattern 18 at a region where the wiring pattern 18 is formed and the bottom surface 12b of the substrate 12 at the remaining region where the wiring pattern 18 is not formed. Generally speaking, the force of adhesion between a moisture-proof film and an electro-conductive pattern is relatively strong in comparison with the force of adhesion between a moisture-proof film and a substrate. Therefore, the configuration of the electronic apparatus 10 according to the present embodiment of the invention features the increased strength of adhesion between the second moisture-proof film 30 and the non-image-display-side sealing region formed on the bottom surface 12b of the substrate 12. For this reason, the electronic apparatus 10 according to the present embodiment of the invention offers enhanced protection against any undesirable permeation of moisture into the electrophoresis element 20.

In the configuration of the electronic apparatus 10 according to the present embodiment of the invention, the wiring pattern 18, which is electrically connected to the driving electrode 16, is formed on the bottom surface 12b of the substrate 12. However, the invention is not limited to the configuration described above. As a non-limiting modification example thereof, an alternative wiring pattern that is electrically connected to the driving electrode 16 may be formed on the top surface 12a of the substrate 12 in place of the bottom surface 12b thereof. In such a modified configuration, one part of the above-mentioned wiring pattern is formed at the display area 12c, whereas the other part thereof extends from the display area 12c in an outward direction so as to pass through the region where the penetration hole portion 14 is not formed. The alternative wiring pattern according to such a modification example is not shown in the drawing. The wiring pattern may be electrically connected to an element or a circuit other than the driving electrode 16. In such a modified configuration, at a non-open part of the peripheral region around the display area 12c of the substrate 12 where the penetration hole portion 14 is not formed, the first moisture-proof film 28 is adhered to the wiring pattern at a region where the wiring pattern is formed and the top surface 12a of the substrate 12 at the remaining region where the wiring pattern is not formed. Therefore, the electronic apparatus 10 according to the modification example described above offers enhanced protection against any undesirable permeation of moisture into the electrophoresis element 20.

Though not shown in the drawing, the electronic apparatus 10 is further provided with a circuit unit(s) other than those described above that is/are required for the operation thereof. In addition, wiring pattern(s) other than those described above that is/are required for the operation thereof is/are formed on the top surface 12a of the substrate 12 and/or the bottom surface 12b thereof as well as a circuit component(s) other than those described above that is/are required for the operation thereof.

Figure 3A:
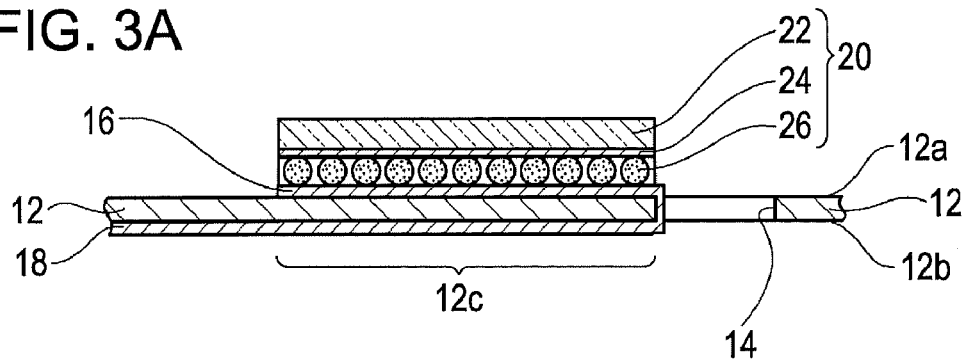
FIGS. 3A, 3B, and 3C is a set of sectional views that schematically illustrates an example of a method for producing a display device (electronic apparatus) according to the first embodiment of the invention.
Figure 3B:
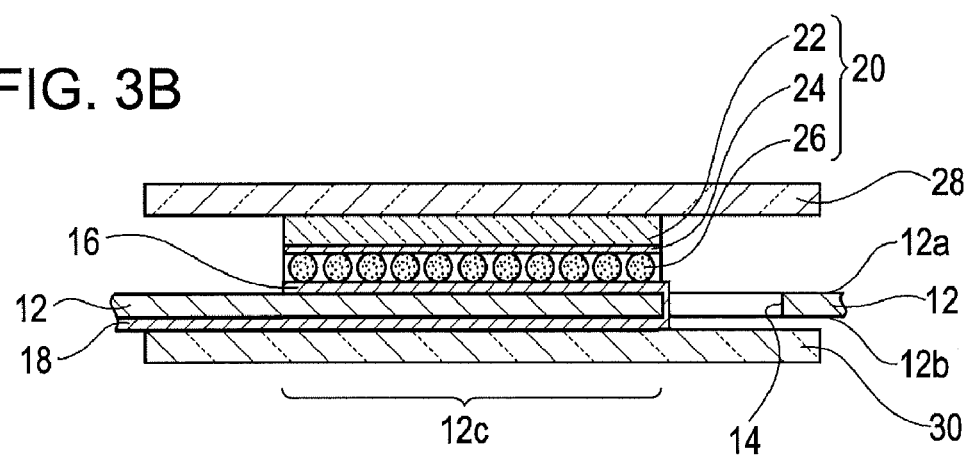
Figure 3C:
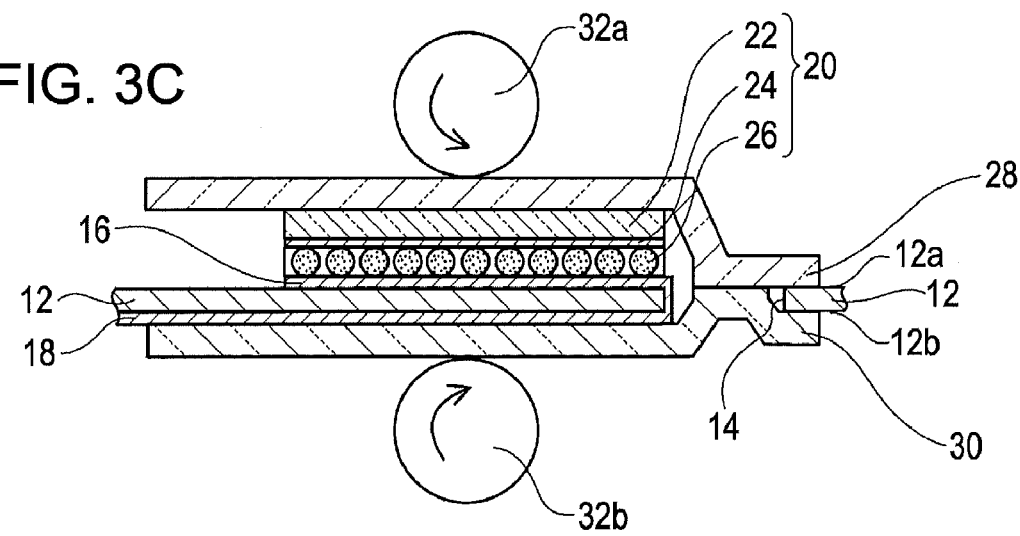

Next, with reference to the accompanying drawings, a method for producing an electronic apparatus having the configuration described above is explained below. FIGS. 3A, 3B, and 3C is a set of sectional views that schematically illustrates an example of a method for producing a display device (electronic apparatus) according to the first embodiment of the invention.

As a first step of the method for producing the electronic apparatus 10 according to the present embodiment of the invention, the electrophoresis element 20 is formed/provided over the display area 12c of the top surface 12a of the substrate 12. Though not shown in the drawing, prior to the first step of the production process described above, the wiring pattern(s) other than the wiring pattern 18 that is/are required for the operation of the electronic apparatus 10 and the circuit component(s) that is/are required for the operation thereof are formed/provided/mounted on the top surface 12a of the substrate 12 and/or the bottom surface 12b thereof.

Next, the penetration hole portion 14 is formed at not the whole but a part of a peripheral region around the display area 12c of the substrate 12. The penetration hole portion 14 can be formed by, for example, press-working the substrate 12 by means of a pressing die (i.e., press die). However, the method for formation of the penetration hole portion 14 is not limited to the presswork method (or a stamp-out method) described above. As a non-limiting modification example thereof, the penetration hole portion 14 may be formed by means of a blade-cutting method. As another non-limiting modification example thereof, the penetration hole portion 14 may be formed by means of a laser-cutting method. The formation of the penetration hole portion 14 may be performed prior to the providing of the electrophoresis element 20 over the display area 12c of the top surface 12a of the substrate 12.

Next, as illustrated in FIG. 3B, at the top-surface side (12a) of the substrate 12, the first moisture-proof film 28 is formed to cover the display area 12c, the electrophoresis element 20, and a peripheral region around the penetration hole portion 14 of the top surface 12a (including the penetration hole portion 14). Thereafter, at the bottom-surface side (12a) of the substrate 12, the second moisture-proof film 30 is formed to cover the display area 12c and a peripheral region around the penetration hole portion 14 of the bottom surface 12b (including the penetration hole portion 14). The formation of the second moisture-proof film 30 may be performed prior to the formation of the first moisture-proof film 28.

Then, as illustrated in FIG. 3C, the first moisture-proof film 28 and the second moisture-proof film 30 are adhered to each other at the penetration hole portion 14. In order to adhere the first moisture-proof film 28 and the second moisture-proof film 30 to each other at the penetration hole portion 14, after the heating of the first moisture-proof film 28 and the second moisture-proof film 30 up to a temperature of, for example, 130 degrees C. or higher for four minutes, a pressing force is applied to the first moisture-proof film 28 from the image-display side (i.e., in a direction toward the second moisture-proof film 30) whereas a pressing force is applied to the second moisture-proof film 30 from the non-image-display side (i.e., in a direction toward the first moisture-proof film 28). A roller lamination method, though not limited thereto, may be used so as to apply a pressing force to each of the first moisture-proof film 28 and the second moisture-proof film 30. In the roller lamination method, a pair of pressure-applying rollers (i.e., roll laminators) 32a and 32b is used. Specifically, the pressure-applying roller 32a applies a pressing force to the entire region of the first moisture-proof film 28 from the image-display side, that is, in a direction toward the second moisture-proof film 30, whereas the pressure-applying roller 32b applies a pressing force to the entire region of the second moisture-proof film 30 from the non-image-display side, that is, in a direction toward the first moisture-proof film 28. By this means, the first moisture-proof film 28 and the second moisture-proof film 30 are adhered to each other at the penetration hole portion 14. As a non-limiting modification example of the above configuration, a vacuum laminator may be used for application of a pressing force for each.

Subsequently, the first moisture-proof film 28 is adhered to the image-display-side sealing region of the top surface 12a of the substrate 12. On the other hand, the second moisture-proof film 30 is adhered to the non-image-display-side sealing region of the bottom surface 12b of the substrate 12. This step (i.e., the adhesion of the first moisture-proof film 28 to the image-display-side sealing region of the top surface 12a of the substrate 12 and the adhesion of the second moisture-proof film 30 to the non-image-display-side sealing region of the bottom surface 12b of the substrate 12) follows immediately after the above-described step (i.e., the adhesion of the first moisture-proof film 28 and the second moisture-proof film 30 to each other) uninterruptedly. In this step, the pressure-applying roller 32a applies a pressing force to the entire region of the first moisture-proof film 28 from the image-display side, that is, in a direction toward the second moisture-proof film 30, whereas the pressure-applying roller 32b applies a pressing force to the entire region of the second moisture-proof film 30 from the non-image-display side, that is, in a direction toward the first moisture-proof film 28. By this means, the first moisture-proof film 28 and the second moisture-proof film 30 are adhered to the image-display-side sealing region of the top surface 12a of the substrate 12 and the non-image-display-side sealing region of the bottom surface 12b of the substrate 12, respectively. The electronic apparatus 10 (refer to FIGS. 1 and 2) according to the present embodiment of the invention can be manufactured through a series of production steps described above.

Second Embodiment

Figure 4:
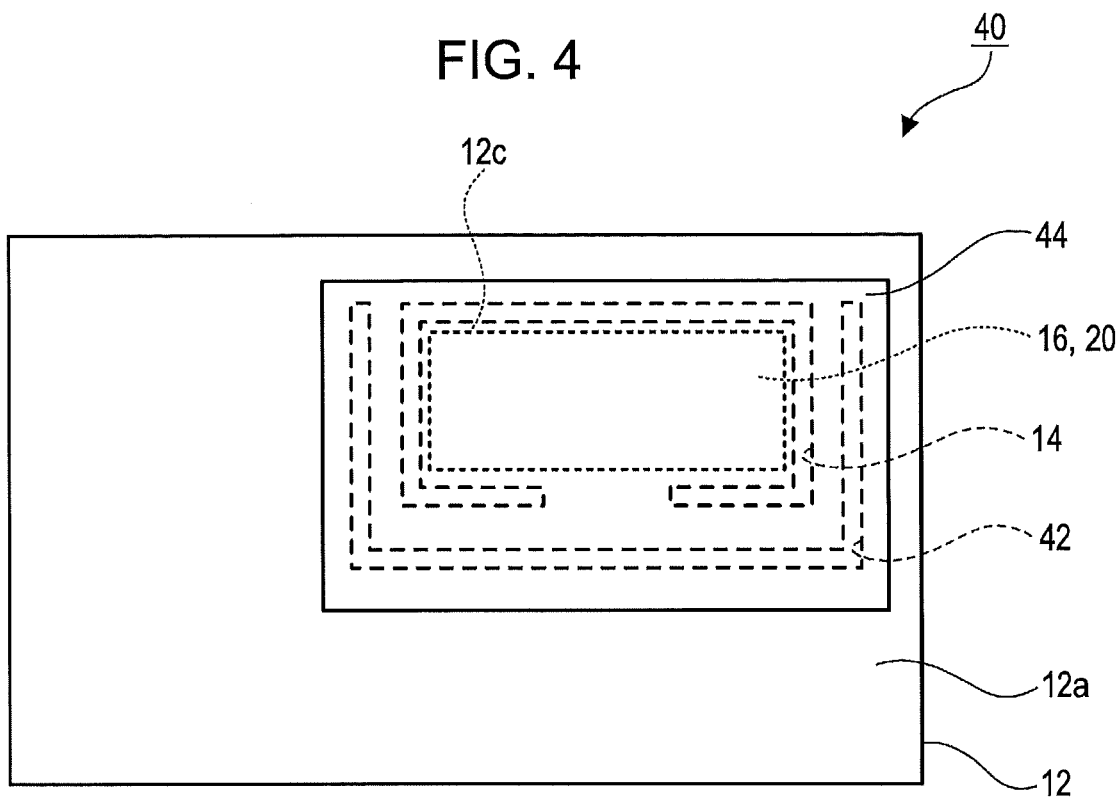
FIG. 4 is a plan view that schematically illustrates an example of the configuration of an electronic apparatus according to a second embodiment of the invention, which is viewed from the image-display side thereof.

Next, with reference to the accompanying drawing, the configuration of an electronic apparatus according to a second embodiment of the invention is explained below. It should be noted that, in the following description of an electronic apparatus 40 according to the second exemplary embodiment of the invention, the same reference numerals are consistently used for the same components as those of the electronic apparatus 10 according to the first exemplary embodiment of the invention so as to omit any redundant explanation or simplify explanation thereof. FIG. 4 is a plan view that schematically illustrates an example of the configuration of the electronic apparatus 40 according to the second embodiment of the invention, which is viewed from the image-display side.

The electronic apparatus 40 according to the present embodiment of the invention has almost the same configuration as that of the electronic apparatus 10 according to the first embodiment of the invention. Specifically, the configuration of the electronic apparatus 40 according to the present embodiment of the invention differs from that of the electronic apparatus 10 according to the first embodiment of the invention only in that, as illustrated in FIG. 4, firstly, a penetration hole portion 42 is formed in the substrate 12 in addition to the penetration hole portion 14, and secondly, a first moisture-proof film 44 and a second moisture-proof film (not shown in the drawing) are formed to cover an area that is larger than the counterpart covered by the first moisture-proof film 28 and the second moisture-proof film 30, thereby further covering a peripheral region around the penetration hole portion 42.

The penetration hole portion 42 is formed substantially in the shape of an alphabet C in a plan view at the outside of the penetration hole portion 14 formed in the substrate 12. As illustrated in the drawing, at least a part of the penetration hole portion 42 is formed at a region corresponding to a remaining (i.e., non-open) part of the peripheral region around the display area 12c of the substrate 12 other than the aforementioned (i.e., open) part of the peripheral region around the display area 12c of the substrate 12 at which the penetration hole portion 14 is formed. Though not shown in the drawing, the wiring pattern 18 may be formed on the bottom surface 12b of the substrate 12 in such a manner that it extends between the penetration hole portion 14 and the penetration hole portion 42.

As illustrated in the drawing, the first moisture-proof film 44 is formed to cover the display area 12c, the electrophoresis element 20, a peripheral region around the penetration hole portion 14 of the top surface 12a of the substrate 12, and a peripheral region around the penetration hole portion 42 of the top surface 12a of the substrate 12. The first moisture-proof film 44 is adhered to the second moisture-proof film at the penetration hole portion 14 and the penetration hole portion 42. In addition, the first moisture-proof film 44 is adhered to the top surface 12a at the whole of the peripheral region around the display area 12c of the substrate 12.

On the other hand, though not shown in the drawing, the second moisture-proof film is formed to cover the display area 12c, a peripheral region around the penetration hole portion 14 of the bottom surface 12b of the substrate 12, and a peripheral region around the penetration hole portion 42 of the bottom surface 12b of the substrate 12. The second moisture-proof film is adhered to the first moisture-proof film 44 at the penetration hole portion 14 and the penetration hole portion 42. In addition, the second moisture-proof film is adhered to the wiring pattern 18 at a region where the wiring pattern 18 is formed, whereas the second moisture-proof film is adhered to the bottom surface 12b of the substrate 12 at the remaining region where the wiring pattern 18 is not formed.

As explained above, in the configuration of the electronic apparatus 40 according to the present embodiment of the invention, a plurality of penetration hole portions, that is, the penetration hole portion 14 and the penetration hole portion 42, is formed around the display area 12c of the substrate 12 (though the penetration hole portion 42 is not formed immediately around the display area 12c of the substrate 12 in an exact sense). In addition, in the configuration of the electronic apparatus 40 according to the present embodiment of the invention, either the penetration hole portion 14 or the penetration hole portion 42 is formed so as to correspond to some points/positions on the periphery of the display area 12c of the substrate 12, whereas both of the penetration hole portion 14 and the penetration hole portion 42 are formed so as to correspond to other points/positions on the periphery of the display area 12c of the substrate 12. Having such a configuration, the electronic apparatus 40 according to the present embodiment of the invention provides a complete enclosure over the entire peripheral region of the display area 12c of the substrate 12. Moreover, the first moisture-proof film 44 and the second moisture-proof film are adhered to each other both at the penetration hole portion 14 and the penetration hole portion 42. Having such a configuration, the electronic apparatus 40 according to the present embodiment of the invention makes it possible to prevent any kind of moisture/vapor from permeating into the electrophoresis element 20 with a further increased reliability because the region at which the first moisture-proof film 44 and the second moisture-proof film are adhered to each other corresponds to every point/position on the entire peripheral region of the display area 12c of the substrate 12, thereby providing a complete enclosure for greater protection.

Third Embodiment

Figure 5:
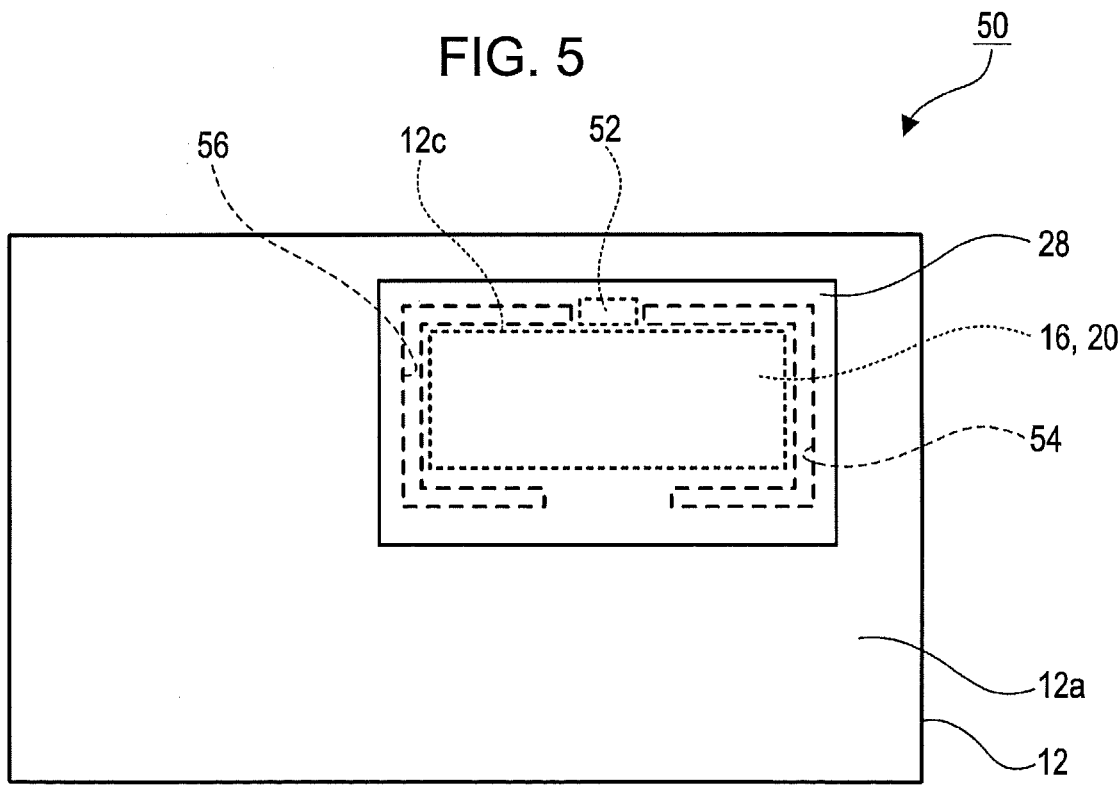
FIG. 5 is a plan view that schematically illustrates an example of the configuration of an electronic apparatus according to a third embodiment of the invention, which is viewed from the image-display side thereof.

Next, with reference to the accompanying drawing, the configuration of an electronic apparatus according to a third embodiment of the invention is explained below. It should be noted that, in the following description of an electronic apparatus 50 according to the third exemplary embodiment of the invention, the same reference numerals are consistently used for the same components as those of the electronic apparatus 10 according to the first exemplary embodiment of the invention so as to omit any redundant explanation or simplify explanation thereof. FIG. 5 is a plan view that schematically illustrates an example of the configuration of the electronic apparatus 50 according to the third embodiment of the invention, which is viewed from the image-display side.

The electronic apparatus 50 according to the present embodiment of the invention has almost the same configuration as that of the electronic apparatus 10 according to the first embodiment of the invention. Specifically, the configuration of the electronic apparatus 50 according to the present embodiment of the invention differs from that of the electronic apparatus 10 according to the first embodiment of the invention only in that, as illustrated in FIG. 5, wiring pattern 52, a penetration hole portion 54, and a penetration hole portion 56 are formed on/in the substrate 12.

Each of the penetration hole portion 54 and the penetration hole portion 56 is formed at a part of the peripheral region of the display area 12c of the substrate 12 substantially in the shape of an alphabet C in a plan view. Specifically, the penetration hole portion 54 and the penetration hole portion 56 are formed as if the penetration hole portion 14 of the electronic apparatus 10 according to the first embodiment of the invention were split into two of "sub penetration hole portions" thereof. The wiring pattern 52 is formed on the top surface 12a of the substrate. The wiring pattern 52 is formed at a part of the peripheral region of the display area 12c of the substrate 12 that is opposite (i.e., the reverse-side position of) the wiring pattern 18 (not shown in FIG. 5), which is formed on the bottom surface 12b (not shown in FIG. 5) of the substrate 12. The wiring pattern 52 is formed as, though not necessarily limited thereto, a dummy pattern. The wiring pattern 52 may be electrically connected to the driving electrode 16 or a circuit unit (not shown therein) that is formed on the substrate 12. Each of the penetration hole portion 54 and the penetration hole portion 56 is formed at a part of the peripheral region of the display area 12c of the substrate 12 in such a manner that they are provided opposite to (i.e., face) each other with some non-open regions being interposed therebetween, where the non-open regions are made up of a top-side (12a) region corresponding to a bottom-side (12b) wired region at which the wiring pattern 18 is formed and another top-side (12a) region (i.e., top-side wired region) on which the wiring pattern 52 is formed.

As illustrated in the drawing, the first moisture-proof film 28 is formed to cover the display area 12c, the electrophoresis element 20, a peripheral region around the penetration hole portion 54 of the top surface 12a of the substrate 12, and a peripheral region around the penetration hole portion 56 of the top surface 12a of the substrate 12. The first moisture-proof film 28 is adhered to the second moisture-proof film 30, which is not illustrated in FIG. 5, at the penetration hole portion 54 and the penetration hole portion 56. In addition, the first moisture-proof film 28 is adhered to the wiring pattern 52 at a region where the wiring pattern 52 is formed among the whole of the peripheral region around the display area 12c of the substrate 12. On the other hand, the first moisture-proof film 28 is adhered to the top surface 12a of the substrate 12 at the remaining region where the wiring pattern 52 is not formed. On the other hand, though not shown in the drawing, the second moisture-proof film 30 is formed to cover the display area 12c, a peripheral region around the penetration hole portion 54 of the bottom surface 12b of the substrate 12, and a peripheral region around the penetration hole portion 56 of the bottom surface 12b of the substrate 12. The second moisture-proof film 30 is adhered to the first moisture-proof film 28 at the penetration hole portion 54 and the penetration hole portion 56. In addition, the second moisture-proof film 30 is adhered to the wiring pattern 18 at a region where the wiring pattern 18 is formed, whereas the second moisture-proof film 30 is adhered to the bottom surface 12b of the substrate 12 at the remaining region where the wiring pattern 18 is not formed.

As explained above, in the configuration of the electronic apparatus 50 according to the present embodiment of the invention, a plurality of penetration hole portions, that is, the penetration hole portion 54 and the penetration hole portion 56, is formed around the display area 12c of the substrate 12. It should be particularly noted that, among the entire periphery of the display area 12c of the substrate 12, a combination of the penetration hole portion 54 and the penetration hole portion 56 is formed at substantially the same position as that of the penetration hole portion 14 of the electronic apparatus 10 according to the first embodiment of the invention. In the configuration of the electronic apparatus 50 according to the present embodiment of the invention, as has already been explained above, the penetration hole portion 54 and the penetration hole portion 56 are not formed at the above-mentioned top-side (12a) region corresponding to the bottom-side (12b) wired region at which the wiring pattern 18 is formed and the above-mentioned top-side (12a) wired region on which the wiring pattern 52 is formed out of the entire periphery of the display area 12c of the substrate 12. With such a configuration, these two non-open regions support the display area 12c of the substrate 12 around which the penetration hole portion 54 and the penetration hole portion 56 are formed. Such a structure makes it possible to prevent, or at least suppress, the deformation of the substrate 12 that could otherwise occur when the electrophoresis element 20 is mounted onto the display area 12c of the substrate 12. Therefore, the electronic apparatus 50 according to the present embodiment of the invention makes it possible to prevent any kind of moisture/vapor from permeating into the electrophoresis element 20 as reliably as the electronic apparatus 10 according to the first embodiment of the invention can without sacrificing the productivity/work-performance thereof in the process of production of the electronic apparatus 50.

In addition, in the configuration of the electronic apparatus 50 according to the present embodiment of the invention, the first moisture-proof film 28 is adhered to the image-display-side sealing region of the top surface 12a of the substrate 12 that includes the wiring pattern 52. As has already been explained above, generally speaking, the force of adhesion between a moisture-proof film and an electro-conductive pattern is relatively strong in comparison with the force of adhesion between a moisture-proof film and a substrate. Therefore, the configuration of the electronic apparatus 50 according to the present embodiment of the invention features the increased strength of adhesion between the first moisture-proof film 28 and the image-display-side sealing region formed on the top surface 12a of the substrate 12.

Fourth Embodiment

Figure 6:
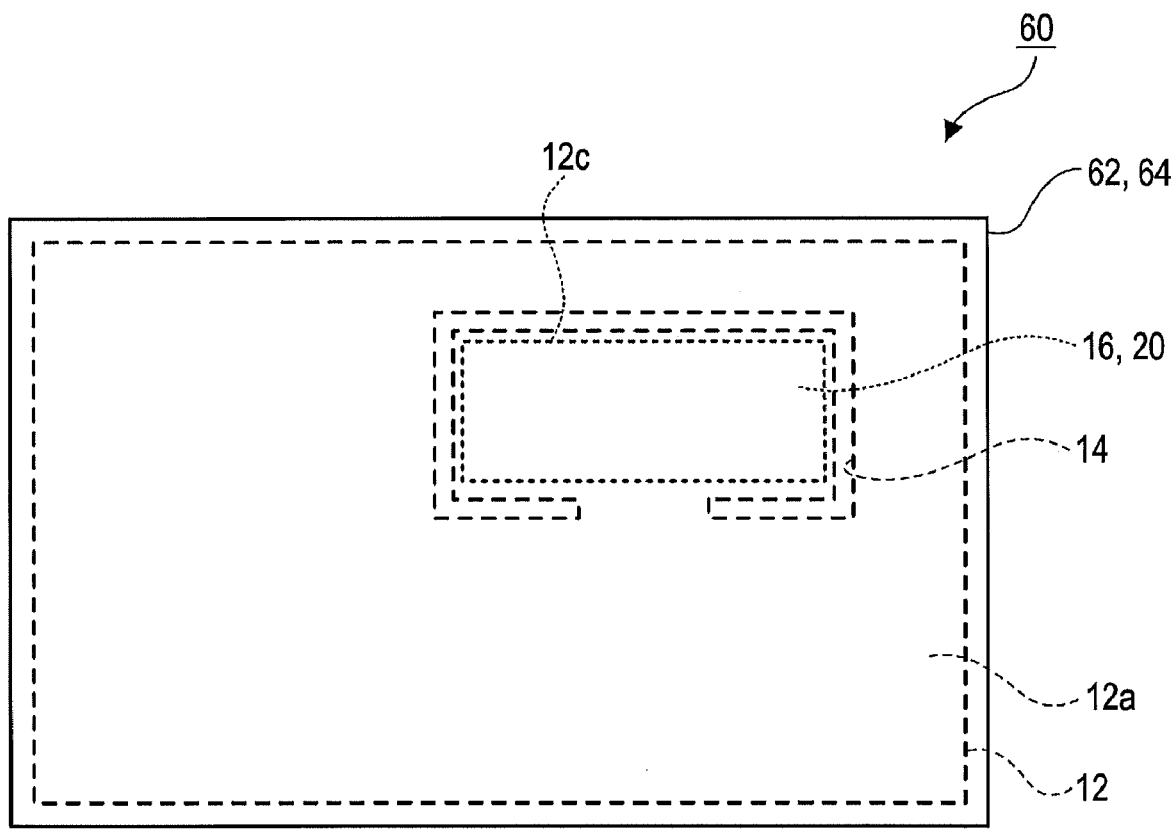
FIG. 6 is a plan view that schematically illustrates an example of the configuration of an electronic apparatus according to a fourth embodiment of the invention, which is viewed from the image-display side thereof.

Next, with reference to the accompanying drawing, the configuration of an electronic apparatus according to a fourth embodiment of the invention is explained below. It should be noted that, in the following description of an electronic apparatus 60 according to the fourth exemplary embodiment of the invention, the same reference numerals are consistently used for the same components as those of the electronic apparatus 10 according to the first exemplary embodiment of the invention so as to omit any redundant explanation or simplify explanation thereof. FIG. 6 is a plan view that schematically illustrates an example of the configuration of the electronic apparatus 60 according to the fourth embodiment of the invention, which is viewed from the image-display side.

The electronic apparatus 60 according to the present embodiment of the invention has almost the same configuration as that of the electronic apparatus 10 according to the first embodiment of the invention. Specifically, the configuration of the electronic apparatus 60 according to the present embodiment of the invention differs from that of the electronic apparatus 10 according to the first embodiment of the invention only in that, as illustrated in FIG. 6, a first moisture-proof film 62 and a second moisture-proof film 64 are adhered to each other at the fringe region (i.e., outer edges) of the substrate 12.

As illustrated in the drawing, the first moisture-proof film 62 is formed to cover the top surface 12a of the substrate 12 and the electrophoresis element 20. The first moisture-proof film 62 has a margin portion at the edges of the substrate 12. On the other hand, the second moisture-proof film 64 is formed to cover the bottom surface 12b (not shown in FIG. 6) of the substrate 12. Likewise the first moisture-proof film 62, the second moisture-proof film 64 has a margin portion at the edges of the substrate 12. The first moisture-proof film 62 and the second moisture-proof film 64 are adhered to each other at the penetration hole portion 14. In addition thereto, the margin portion of the first moisture-proof film 62 and the margin portion of the second moisture-proof film 64 are adhered to each other at the edges (i.e., fringe region) of the substrate 12. It is preferable that each of the margin portion of the first moisture-proof film 62 and the margin portion of the second moisture-proof film 64 that are adhered to each other at the edges of the substrate 12 should have a width of 0.5 mm or greater.

As explained above, in the configuration of the electronic apparatus 60 according to the present embodiment of the invention, the margin portion of the first moisture-proof film 62 and the margin portion of the second moisture-proof film 64 are adhered to each other at the edges of the substrate 12 so as to envelope the substrate 12 and the electrophoresis element 20. With such a configuration, the entire body of the electronic apparatus 60 is sealed because a pair of the moisture-proof films 62 and 64 is adhered to each other at the edges of the substrate 12. For this reason, the electronic apparatus 60 according to the present embodiment of the invention offers further enhanced protection against any undesirable permeation of moisture into the electrophoresis element 20. If there is a necessity to form an opening (region) that is used when a user replaces batteries or for any other purpose, the above-described configuration of the electronic apparatus 60 may be modified in such a manner that either one or both of the first moisture-proof film 62 and the second moisture-proof film 64 has/have the opening.

The electronic apparatus 60 has the electrophoresis element 20 as its display element. As has already been explained above, the electrophoresis element 20 is capable of continuing image display even when power is not continuously supplied thereto. Therefore, the electronic apparatus 60 that has the electrophoresis element 20 features reduced power consumption, which results in extended battery life. In addition, if the configuration of the electronic apparatus 60 described above is modified in such a manner that the electrophoresis element 20 is driven under an externally induced energy by means of a wireless medium so as to control (e.g., change) images that are displayed by the electrophoresis element 20, it is possible to omit any built-in power supply from the configuration of the electronic apparatus 60. Thus, since the electronic apparatus 60 is provided with the electrophoresis element 20, it is possible to omit any opening that is used when a user replaces batteries or for any other purpose from the configuration thereof.

The electronic apparatus 60 according to the present embodiment of the invention can be produced in the same manner as, or in a similar manner to, the production of the electronic apparatus 10 according to the first embodiment of the invention. Specifically, a pressing force is applied to each of the first moisture-proof film 62 and the second moisture-proof film 64 so that the margin portion of the first moisture-proof film 62 and the margin portion of the second moisture-proof film 64 are adhered to each other at the edges of the substrate 12. In the production of the electronic apparatus 60 according to the present embodiment of the invention, after the margin portion of the first moisture-proof film 62 and the margin portion of the second moisture-proof film 64 have been adhered to each other at the fringe region of the substrate 12, the edges of these margin portions adhered to each other may be cut so as to ensure that the outer edge of the first moisture-proof film 62 is "in alignment with" that of the second moisture-proof film 64. If so modified, in the process of positioning the first moisture-proof film 62 and the second moisture-proof film 64 on the substrate 12, it is possible to tolerate a margin of error in the alignment thereof to some degree. The above-described production of the electronic apparatus 60 according to the present embodiment of the invention may be further modified in such a manner that each of the first moisture-proof film 62 and the second moisture-proof film 64 is configured as a kind of tape, where the tape-shaped first moisture-proof film 62 is placed on the top-surface (12a) side of a plurality of substrates 12 whereas the tape-shaped second moisture-proof film 64 is placed on the bottom-surface (12b) side of the plurality of substrates 12. In such a non-limiting modification example, after the margin portion of the first moisture-proof film 62 and the margin portion of the second moisture-proof film 64 have been adhered to each other at the fringe region of each of the plurality of substrates 12, the edges of these margin portions adhered to each other is cut so as to ensure that the outer edge of the first moisture-proof film 62 is in alignment with that of the second moisture-proof film 64 for each of the plurality of substrates 12. Such a production method has an advantage in that it is possible to manufacture the plurality of substrates 12 in a single batch production in a sequential manner.

Although an electronic apparatus having distinctively unique features of the present invention is described above while explaining preferred exemplary embodiments thereof, the invention should be in no case interpreted to be limited to the specific embodiments described above. The invention may be modified, altered, changed, adapted, and/or improved within a range not departing from the gist and/or spirit of the invention apprehended by a person skilled in the art from explicit and implicit description made herein, where such a modification, an alteration, a change, an adaptation, and/or an improvement is also covered by the scope of the appended claims. The followings are non-limiting examples of a modification, an alteration, a change, an adaptation, and/or an improvement of the preferred exemplary embodiments described above.

Variation Example

In the foregoing exemplary embodiments of the invention described above, each of the electronic apparatus 10, the electronic apparatus 40, the electronic apparatus 50, and the electronic apparatus 60 is provided with the electrophoresis element 20 as the display element thereof. However, the invention is not limited to such a specific configuration. As a non-limiting modification example thereof, each of the electronic apparatus 10, the electronic apparatus 40, the electronic apparatus 50, and the electronic apparatus 60 may be provided with a liquid crystal display element or an organic electroluminescence (EL) element as its display element.

A conventional technique that is known in the art can be adopted for any configurations and/or production processes that are not explicitly explained in the foregoing exemplary embodiments of the invention and the variation examples thereof.

Examples of Electronic Apparatuses

Figure 7:
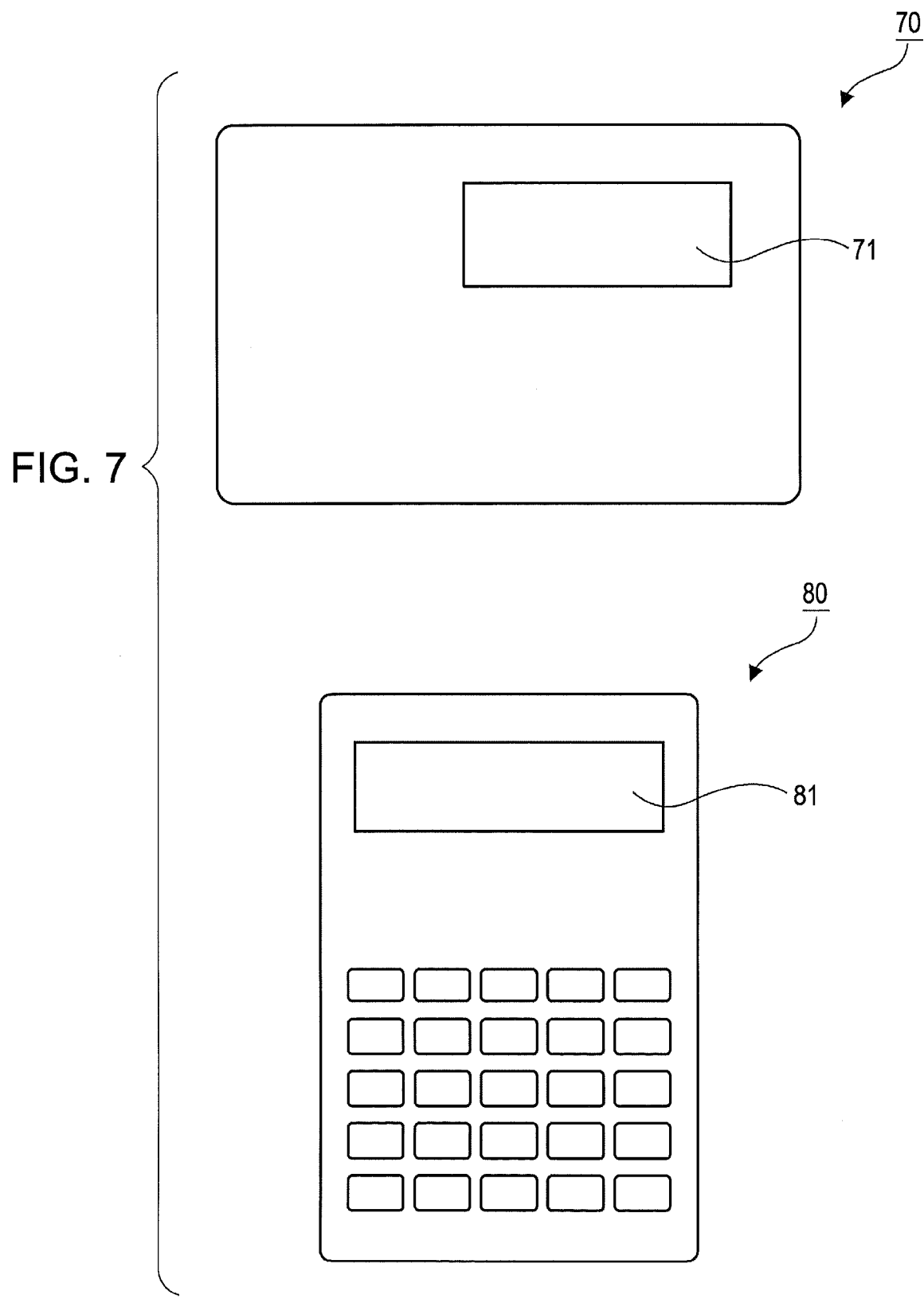
FIG. 7 is a diagram that schematically illustrates the configuration of a set of examples of an electronic apparatus according to an exemplary embodiment of the invention.

FIG. 7 is a diagram that schematically illustrates the configuration of a set of examples (not related to each other) of an electronic apparatus according to an exemplary embodiment of the invention. FIG. 8 is a diagram that schematically illustrates the configuration of another set (not related to each other) of examples of an electronic apparatus according to an exemplary embodiment of the invention. The electronic apparatus according to the invention may be embodied as, with no intention of limitation thereto, a card-type electronic apparatus 70 as illustrated in FIG. 7A. The card-type electronic apparatus 70 has a display element 70 at the display portion (i.e., display unit) thereof. A few examples of the card-type electronic apparatus 70 include a credit card, an ID card, or the like. As another example, the electronic apparatus according to the invention may be embodied as, with no intention of limitation thereto, an electronic calculator 80 as illustrated in FIG. 7B. The electronic calculator 80 is provided with a display element 81 at the display portion thereof. As still another example, the electronic apparatus according to the invention may be embodied as, with no intention of limitation thereto, a mobile phone 90 as illustrated in FIG. 8A. The mobile phone 90 is provided with a display element 91 at the display portion thereof. As still another example, the electronic apparatus according to the invention may be embodied as, with no intention of limitation thereto, a wristwatch 100 as illustrated in FIG. 8B. The wristwatch 100 is provided with a display element 101 at the display portion thereof.

What is claimed is:

1. An electronic apparatus comprising:
   a substrate that has a through hole at a part of a periphery around a display area of the substrate;
   a display element that is provided over the display area of one surface of the substrate;
   a first moisture-proof film that has optical transparency and covers, at least, the display area of the above-mentioned one surface of the substrate and the display element; and
   a second moisture-proof film that covers, at least, the display area of another opposite surface of the substrate,
   wherein the first moisture-proof film is adhered to a sealing region of the above-mentioned one surface of the substrate;
   the second moisture-proof film is adhered to a sealing region of the above-mentioned another opposite surface of the substrate; and
   the first moisture-proof film and the second moisture-proof film are adhered to each other at the through hole,
   whereby a combination of the first moisture-proof film and the second moisture-proof film seals the display element.

2. The electronic apparatus according to Claim 1, wherein the substrate has a plurality of the through holes at the periphery around the display area of the substrate; and the first moisture-proof film and the second moisture-proof film are adhered to each other at each of the plurality of through holes.

3. The electronic apparatus according to Claim 2, wherein at least one of the plurality of through holes corresponds to each position on the entire periphery around the display area of the substrate.

4. The electronic apparatus according to Claim 1, wherein the sealing region of the above-mentioned one surface of the substrate and/or the sealing region of the above-mentioned another opposite surface of the substrate includes wiring pattern that is/are formed on the above-mentioned one surface of the substrate and/or the above-mentioned another opposite surface of the substrate.

5. The electronic apparatus according to Claim 4, wherein the wiring pattern that is/are formed on the above-mentioned one surface of the substrate and/or the above-mentioned another opposite surface of the substrate is/are electrically connected to the display element.

6. The electronic apparatus according to Claim 1, wherein the first moisture-proof film and the second moisture-proof film are adhered to each other at a fringe of the substrate so as to envelope the substrate and the display element.

7. The electronic apparatus according to Claim 1, wherein the substrate further has a first electrode that is provided on the display area of the above-mentioned one surface of the substrate; and the display element is an electrophoresis element that includes an upper electrode having optical transparency, the upper electrode having a second electrode that is provided to face the first electrode, and further includes an electrophoresis layer that is interposed between the first electrode and the second electrode.

8. A moisture-proof structure of an electronic apparatus, comprising:
    a substrate that has a through hole at a part of a periphery around a display area of the substrate;
    a display element that is provided over the display area of one surface of the substrate;
    a first moisture-proof film that has optical transparency and covers, at least, the display area of the above-mentioned one surface of the substrate and the display element; and
    a second moisture-proof film that covers, at least, the display area of another opposite surface of the substrate,
    wherein the first moisture-proof film is adhered to a sealing region of the above-mentioned one surface of the substrate;
    the second moisture-proof film is adhered to a sealing region of the above-mentioned another opposite surface of the substrate; and
    the first moisture-proof film and the second moisture-proof film are adhered to each other at the through hole,
    whereby a combination of the first moisture-proof film and the second moisture-proof film seals the display element.

9. A method for producing an electronic apparatus, comprising:
    providing a display element over a display area of one surface of a substrate;
    forming a through hole at a part of a periphery around the display area of the substrate;
    providing a first moisture-proof film that has optical transparency in such a manner that the first moisture-proof film covers, at least, the display area of the above-mentioned one surface of the substrate and the display element;
    providing a second moisture-proof film in such a manner that the second moisture-proof film covers, at least, the display area of another opposite surface of the substrate;
    adhering the first moisture-proof film and the second moisture-proof film to each other at the through hole;
    adhering the first moisture-proof film to a sealing region of the above-mentioned one surface of the substrate; and
    adhering the second moisture-proof film to a sealing region of the above-mentioned another opposite surface of the substrate.

* * * * *